(12) United States Patent
Tarhani et al.

(10) Patent No.: US 9,406,477 B2
(45) Date of Patent: Aug. 2, 2016

(54) TRAVELING WAVE TUBE LOADED BY A MATERIAL HAVING NEGATIVE PERMITTIVITY AND POSITIVE PERMEABILITY

(71) Applicant: Wisconsin Alumni Research Foundation, Madison, WI (US)

(72) Inventors: Arash Rashidi Tarhani, Madison, WI (US); Nader Behdad, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 14/202,992

(22) Filed: Mar. 10, 2014

(65) Prior Publication Data

US 2015/0256139 A1    Sep. 10, 2015

(51) Int. Cl.
| | |
|---|---|
| H01J 25/34 | (2006.01) |
| H03F 3/58 | (2006.01) |
| H01J 23/24 | (2006.01) |
| H01J 23/30 | (2006.01) |
| H01J 25/38 | (2006.01) |
| H01P 3/123 | (2006.01) |

(52) U.S. Cl.
CPC .............. *H01J 25/34* (2013.01); *H01J 23/24* (2013.01); *H01J 23/30* (2013.01); *H01J 25/38* (2013.01); *H03F 3/58* (2013.01); *H01P 3/123* (2013.01); *H03F 2200/451* (2013.01)

(58) Field of Classification Search
CPC ............ H01J 23/24; H01J 23/30; H01J 25/34

USPC .......................................................... 315/3.5
See application file for complete search history.

(56) References Cited

U.S. PATENT DOCUMENTS

| | | |
|---|---|---|
| 7,218,190 B2 | 5/2007 | Engheta et al. |
| 7,429,957 B1 | 9/2008 | Tonn |
| 8,593,355 B1 | 11/2013 | Tonn |

OTHER PUBLICATIONS

Bhattacharjee et al., Folded Waveguide Traveling-Wave Tube Sources for Terahertz Radiation, IEEE Transactions on Plasma Science, vol. 32, No. 3, Jun. 2004, pp. 1002-1014.
Booske et al., Accurate Parametric Modeling of Folded Waveguide Circuits for Millimeter-Wave Traveling Wave Tubes, IEEE Transactions on Electron Devices, vol. 52, No. 5, May 2005, pp. 685-694.
Tan et al., Wave Energy Amplification in a Metamaterial based Traveling Wave Structure, physics.optics, Cornell University Library, arXiv:1003.5401v1 , Mar. 28, 2010, pp. 1-4.
Shin et al., MEMS fabrications of broadband epsilon negative (ENG) metamaterial electronic circuit for 0.22 THz sheet beam TWT application, Downloaded from http://ieeexplore.ieee.org/xpl/login.jsp?reload=true&tp=&arnumber=5612550&url=http%3A%2F%2Fiee on Feb. 18, 2014, pp. 1-2.

*Primary Examiner* — Benny Lee
(74) *Attorney, Agent, or Firm* — Bell & Manning, LLC

(57) ABSTRACT

A slow wave structure of a traveling wave tube is provided. The slow wave structure includes an input port, an output port, a first material, and a second material. The second material is mounted in the first material at periodic intervals in a direction of propagation of a radio frequency signal between the input port and the output port. The second material has a real part of permittivity that is negative and a real part of permeability that is positive at an operational frequency of the radio frequency signal.

20 Claims, 14 Drawing Sheets

TRAVELING WAVE TUBE LOADED BY A MATERIAL HAVING NEGATIVE PERMITTIVITY AND POSITIVE PERMEABILITY

REFERENCE TO GOVERNMENT RIGHTS

This invention was made with government support under FA9550-11-1-0050 awarded by the USAF/AFOSR. The government has certain rights in the invention.

BACKGROUND

Traveling wave tubes (TWT) are used in various wireless devices including radar systems, satellite communications systems, wireless transponders of microwave backhaul links, etc. A TWT is a vacuum electronic device that acts as a microwave amplifier capable of providing a high gain and high output power. To accomplish this, TWTs use slow-wave structures that support the propagation of an electromagnetic (EM) wave and also accommodate the propagation of an energetic electron beam from within the device. The interaction between the electron beam and the EM wave results in amplification of the EM wave and a consequent boost in the amplitude of the EM wave thereby increasing the output power of the device. The gain of the device is a function of the interaction impedance and the total current of the electron beam, which is limited by the maximum dimensions of the slow-wave structure. As frequency increases, the dimensions of conventional slow-wave structures used in conventional TWTs decrease.

SUMMARY

In an illustrative embodiment, a slow wave structure of a traveling wave tube is provided. The slow wave structure includes, but is not limited to, an input port, an output port, a first material, and a second material. The second material is mounted in the first material at periodic intervals in a direction of propagation of a radio frequency signal between the input port and the output port. The second material has a real part of permittivity that is negative and a real part of permeability that is positive at an operational frequency of the radio frequency signal.

In an illustrative embodiment, a traveling wave tube is provided. The traveling wave tube includes, but is not limited to, a slow wave structure and an electron beam vacuum tube. The slow wave structure includes, but is not limited to, an input port, an output port, a first material, and a second material. The slow wave structure is configured to receive a radio frequency signal through the input port and to output an amplified radio frequency signal through the output port. The radio frequency signal has an operational frequency. The electron beam vacuum tube is configured to receive an electron beam and to focus the electron beam for transmission therethrough. The electron beam vacuum tube is mounted to extend through a center of the slow wave structure defined in a direction of propagation of the electron beam. The second material is mounted in the first material at periodic intervals in a direction of propagation of a radio frequency signal between the input port and the output port. The second material has a real part of permittivity that is negative and a real part of permeability that is positive at an operational frequency of the radio frequency signal.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements, and further wherein the first digit of a three digit reference number and the first two digits of a four digit reference number indicate the figure number in which the element is at least first introduced.

DETAILED DESCRIPTION

Figure 1:
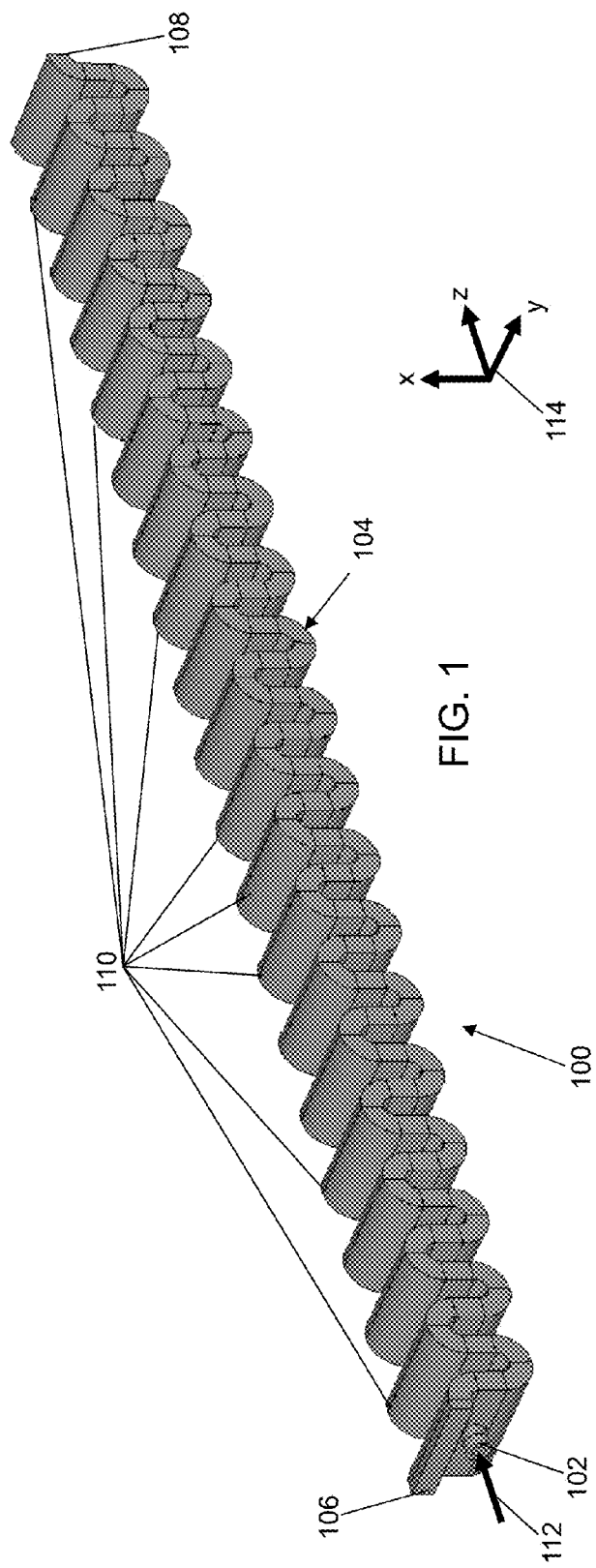
FIG. 1 is a perspective view of a folded waveguide (FW) traveling wave tube (TWT) in accordance with an illustrative embodiment.
Figure 14:
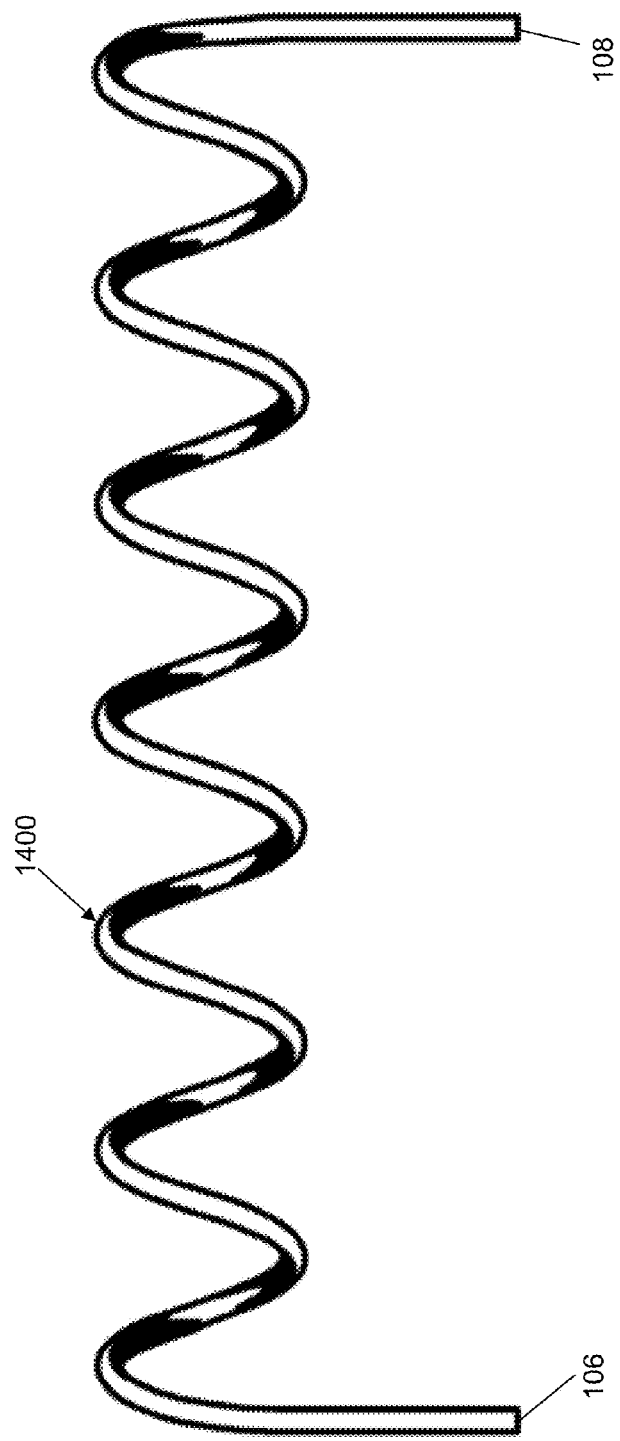
FIG. 14 is a side view of a slow wave structure in the form of a helical coil in accordance with an illustrative embodiment.
Figure 15:
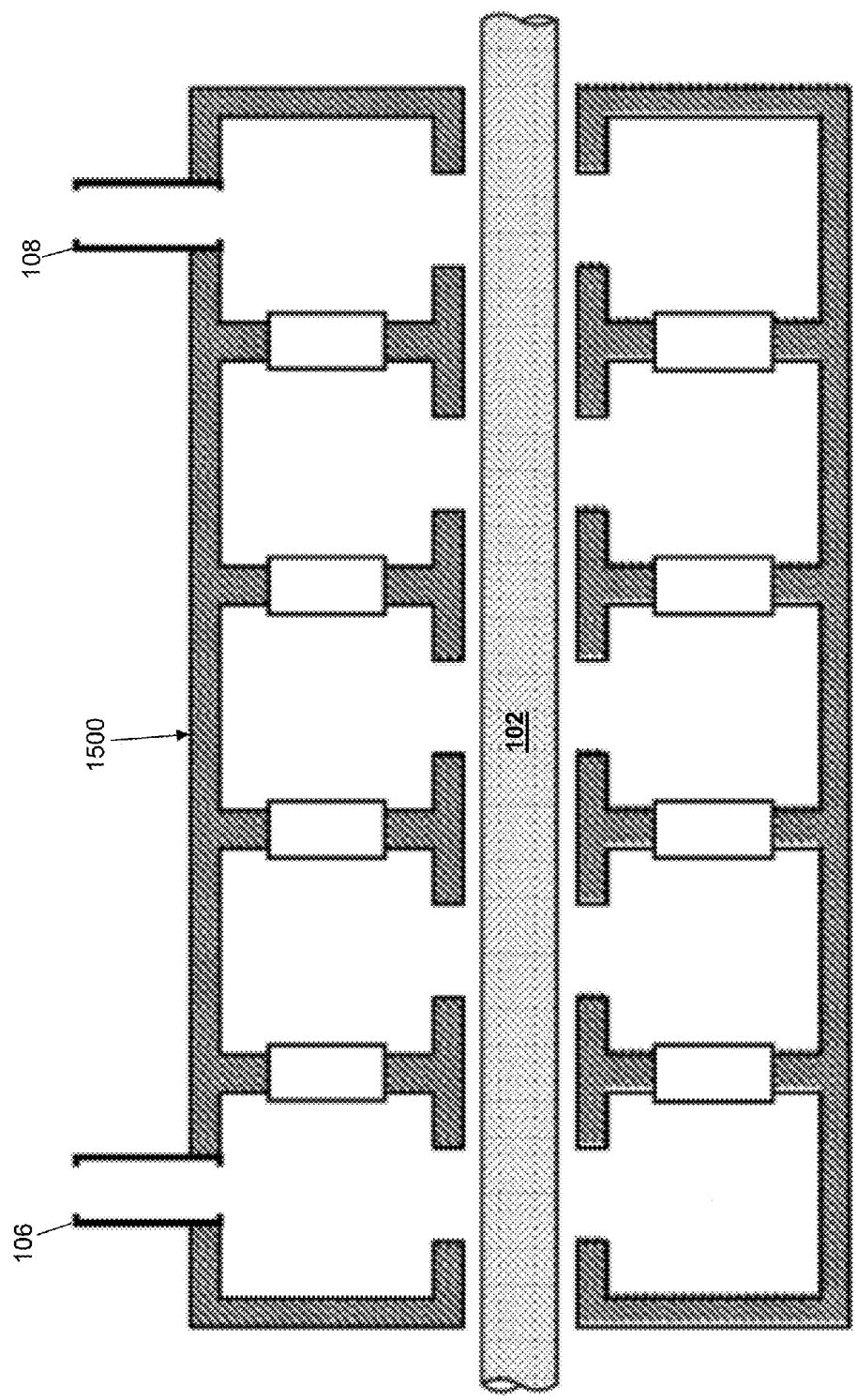
FIG. 15 is a side view of a slow wave structure in the form of a coupled cavity in accordance with an illustrative embodiment.

With reference to FIG. 1, a perspective view of a first traveling wave tube (TWT) 100 is shown in accordance with an illustrative embodiment. TWT 100 may include an electron beam vacuum tube 102 and a slow wave structure (SWS) 104. A radio frequency (RF) signal is input at an input end 106 of SWS 104 and is output at an output end 108 of SWS 104. The RF signal output at output end 108 is amplified relative to the RF signal input at input end 106. SWS 104 includes a plurality of unit cells 110 along a length of SWS 104 in a direction from input end 106 to output end 108. In the illustrative embodiment of FIG. 1, SWS 104 includes 19 identical unit cells that form a serpentine, rectangular folded waveguide. In alternative embodiments, SWS 104 may include a coupled cavity, a helical coil, a parallel plate folded waveguide, etc. For illustration, FIG. 14 shows a helical coil 1400 with input end 106 and output end 108 as understood by a person of skill in the art. For illustration, FIG. 15 shows a coupled cavity 1500 with input end 106, output end 108, and electron beam vacuum tube 102 as understood by a person of skill in the art. FIGS. 14 and 15 were obtained from A. S. Gilmour, Jr., *Klystrons, Traveling Wave Tubes, Magnetrons, Crossed-Field Amplifiers, and Gyrotrons* (2011) and are FIG. 14-17 and FIG. 15-2, respectively, with the text and other extraneous details omitted.

Figure 2:
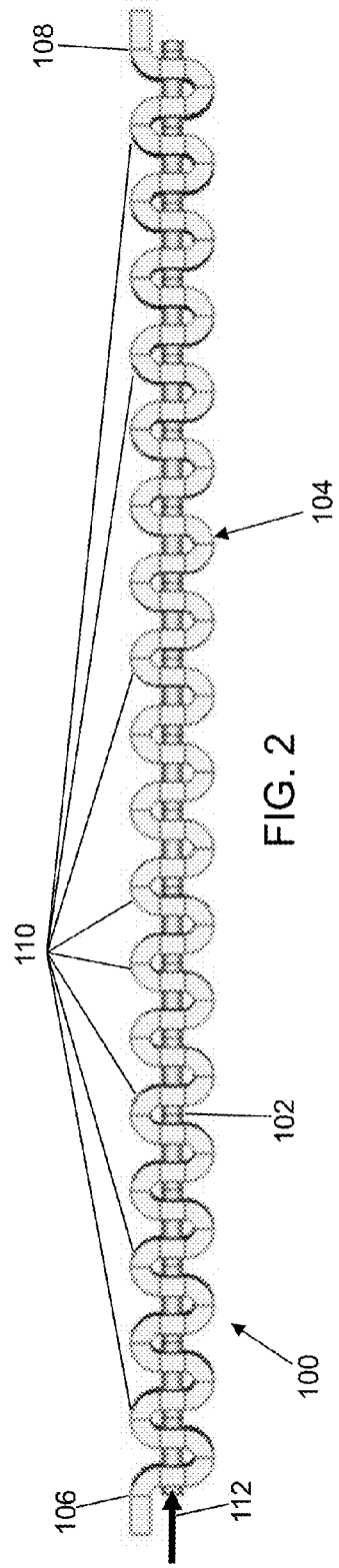
FIG. 2 is a side view of the FWTWT of FIG. 1 in accordance with an illustrative embodiment.

With reference to FIG. 2, a side view of TWT 100 is shown in accordance with an illustrative embodiment. Referring to FIGS. 1 and 2, electron beam vacuum tube 102 extends a length of SWS 104 from input end 106 to output end 108 and through a center of SWS 104 defined in a direction of propagation 112 of the electron beam. A coordinate reference frame 114 defines an x-direction (x in the figures), a y-direction (y in the figures), and a z-direction (z in the figures) that are mutually orthogonal and form a right-handed system. Direction of propagation 112 of the electron beam is parallel to the z-direction of coordinate reference frame 114. The x-direction and y-direction define a cross section of electron beam vacuum tube 102 perpendicular to direction of propagation 112 of the electron beam. Center of SWS 104 is defined in the x-y plane of coordinate reference frame 114.

In an illustrative embodiment, a cross section of SWS 104 perpendicular to a direction of propagation of the RF signal is rectangular though other cross sections including square, circular, and elliptical may be used in alternative embodiments. For example, a square cross section may be used in a coupled cavity SWS 104. As another example, a circular cross section may be used in a helical coil SWS 104.

Figure 3:
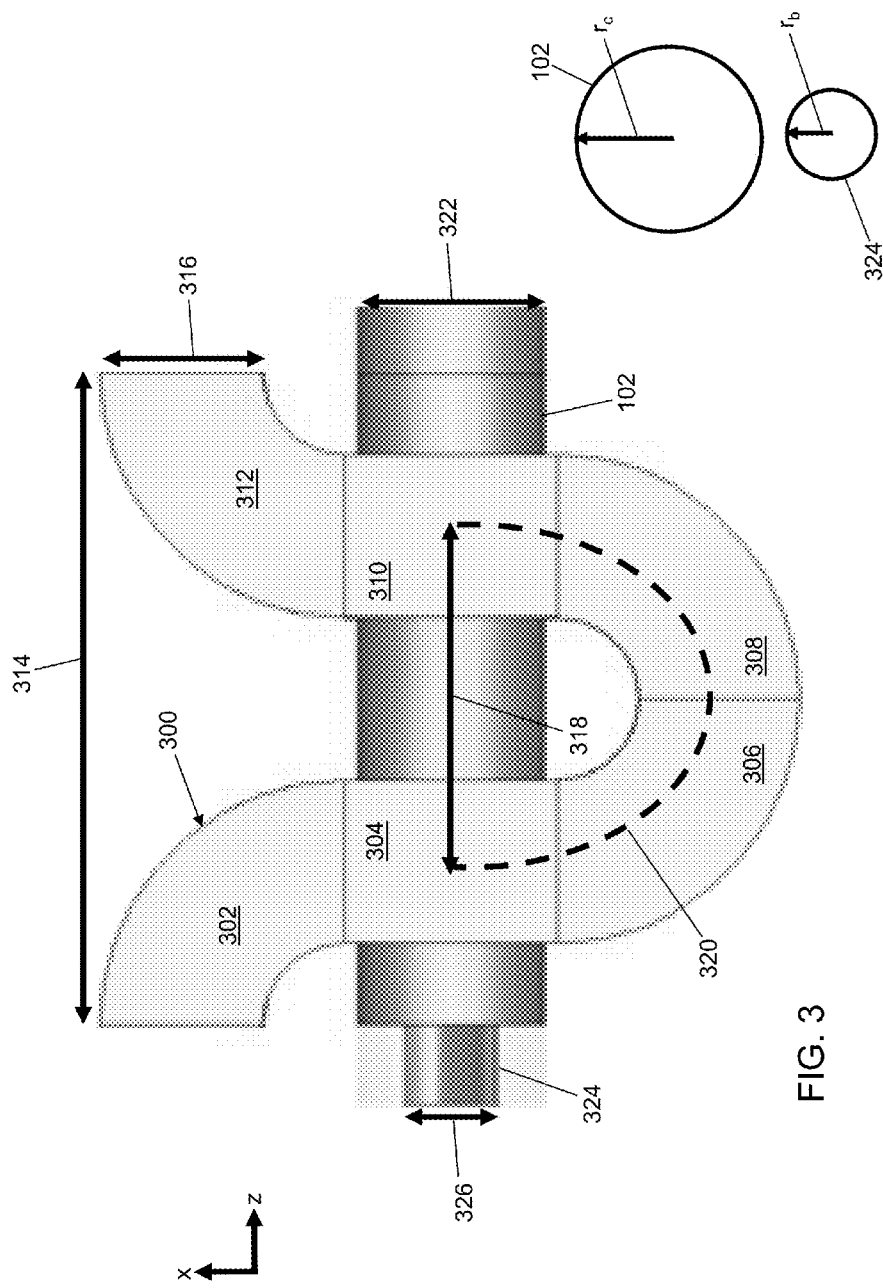
FIG. 3 is a side view of a unit cell of the FWTWT of FIG. 1 in accordance with an illustrative embodiment.

Referring to FIG. 3, a unit cell 300 of SWS 104 is shown in accordance with an illustrative embodiment. Unit cell 300 includes a first waveguide section 302, a second waveguide section 304, a third waveguide section 306, a fourth waveguide section 308, a fifth waveguide section 310, and a sixth waveguide section 312 that form a continuous serpentine "U" shape. Each waveguide section is open where it mounts to the adjacent wave guide section. As understood by a person of skill in the art, the RF signal propagates in the interior of SWS 104, which may be filled with air. The walls that form first waveguide section 302, second waveguide section 304, third waveguide section 306, fourth waveguide section 308, fifth waveguide section 310, and sixth waveguide section 312 may be formed of a material that is conductive at the operational frequency, $f_o$, of TWT 100.

Electron beam vacuum tube 102 extends through a center of second waveguide section 304 and fifth waveguide section 310. Second waveguide section 304 and fifth waveguide section 310 are formed of rectangular cross sections defined by the walls of second waveguide section 304 and fifth waveguide section 310. Second waveguide section 304 is mounted between first waveguide section 302 and third waveguide section 306. Fifth waveguide section 310 is mounted between fourth waveguide section 308 and sixth waveguide section 312. The walls of first waveguide section 302, third waveguide section 306, fourth waveguide section 308, and sixth waveguide section 312 are curved to form an E-plane semi-circular bend in the same manner, but rotated in different directions to form the serpentine external shape.

Figure 4:
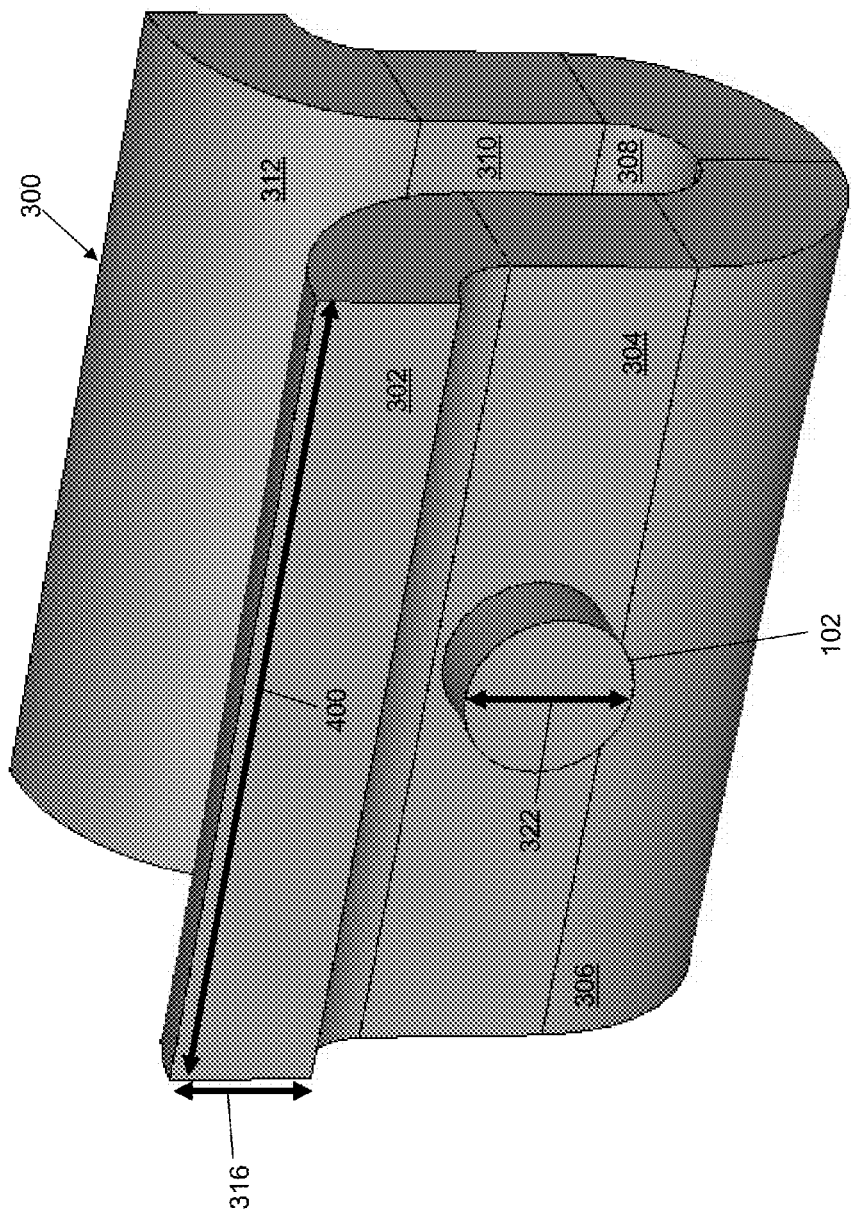
FIG. 4 is a perspective view of the unit cell of the FWTWT of FIG. 3 in accordance with an illustrative embodiment.

A length 314 of unit cell 300 extends between edges of first waveguide section 302 and sixth waveguide section 312. The rectangular cross section of each waveguide section has a cross section height 316 and a cross section width 400 (shown with reference to FIG. 4). Unit cell 300 defines an electron beam path length 318 and an electromagnetic (EM) wave path length 320. Electron beam path length 318 defines a distance between subsequent beam crossings. Electron beam vacuum tube 102 has a diameter 322.

An electron gun (not shown) generates an electron beam 324 in electron beam vacuum tube 102. Electron beam 324 is focused to a beam diameter 326 using magnets around an interior surface of electron beam vacuum tube 102 as understood by a person of skill in the art. For illustration, electrons from a heated cathode are accelerated towards an anode, which is held at a high positive potential with respect to the cathode. A portion of the electrons pass through a hole in the anode to produce electron beam 324. Electron beam 324 travels down electron beam vacuum tube 102 in the z-direction to a collector that is maintained at a high voltage relative to the cathode.

SWS 104 supports propagation of a dominant $TE_{10}$ mode. In an illustrative embodiment, electron beam 324 passes through the tunnel of electron beam vacuum tube 102 having a radius $r_c$ equal to half of diameter 322. In alternative embodiments, radius $r_c$ may be larger or smaller. The axis of electron beam vacuum tube 102 is along the z-direction.

The input RF signal propagates into SWS 104 and interacts with electron beam 324 at beam crossings in second waveguide section 304 and fifth waveguide section 310 in which the $TE_{10}$ electric field and the DC current of electron beam 324 are collinear. When electron beam 324 passes through a first beam crossing in second waveguide section 304, the electrons face the force applied by a collinear electric field of SWS 104, which is alternating at the RF operational frequency, $f_o$.

Due to the alternating force, some electrons are accelerated and other are decelerated. The superposition of the accelerated and decelerated electrons is translated to an RF current with the same frequency as the input RF signal. An RF current amplitude is modulated by the electric field of SWS 104 and provides an additional source of electric field that propagates through electron beam vacuum tube 102. When the electrons arrive at the next beam crossing in fifth waveguide section 310, the electrons face a stronger force applied by a summation of the electric field of SWS 104 and the electric field formed by the RF current at the previous beam crossing. In this manner, both the RF current and the electric field grow as the electrons pass the subsequent beam crossings in the subsequent unit cells of SWS 104. As a result, the RF signal output at output end 108 of SWS 104 is amplified.

The electron gun at input end 106 of SWS 104 emits the electrons with a constant velocity $u_0$ into the tunnel of electron beam vacuum tube 102. In an illustrative embodiment, a relatively large magneto-static field $B_0$ in the direction of the beam velocity is applied to focus electron beam 324 of radius $r_b$ equal to half of beam diameter 326 to define an axially confined flow of electrons. In alternative embodiments, radius $r_b$ may be larger or smaller. SWS 104 is a periodic structure that exhibits a dispersion diagram in which the lower bands of propagation support traveling waves with phase velocities much less than the speed of light.

Figure 5:
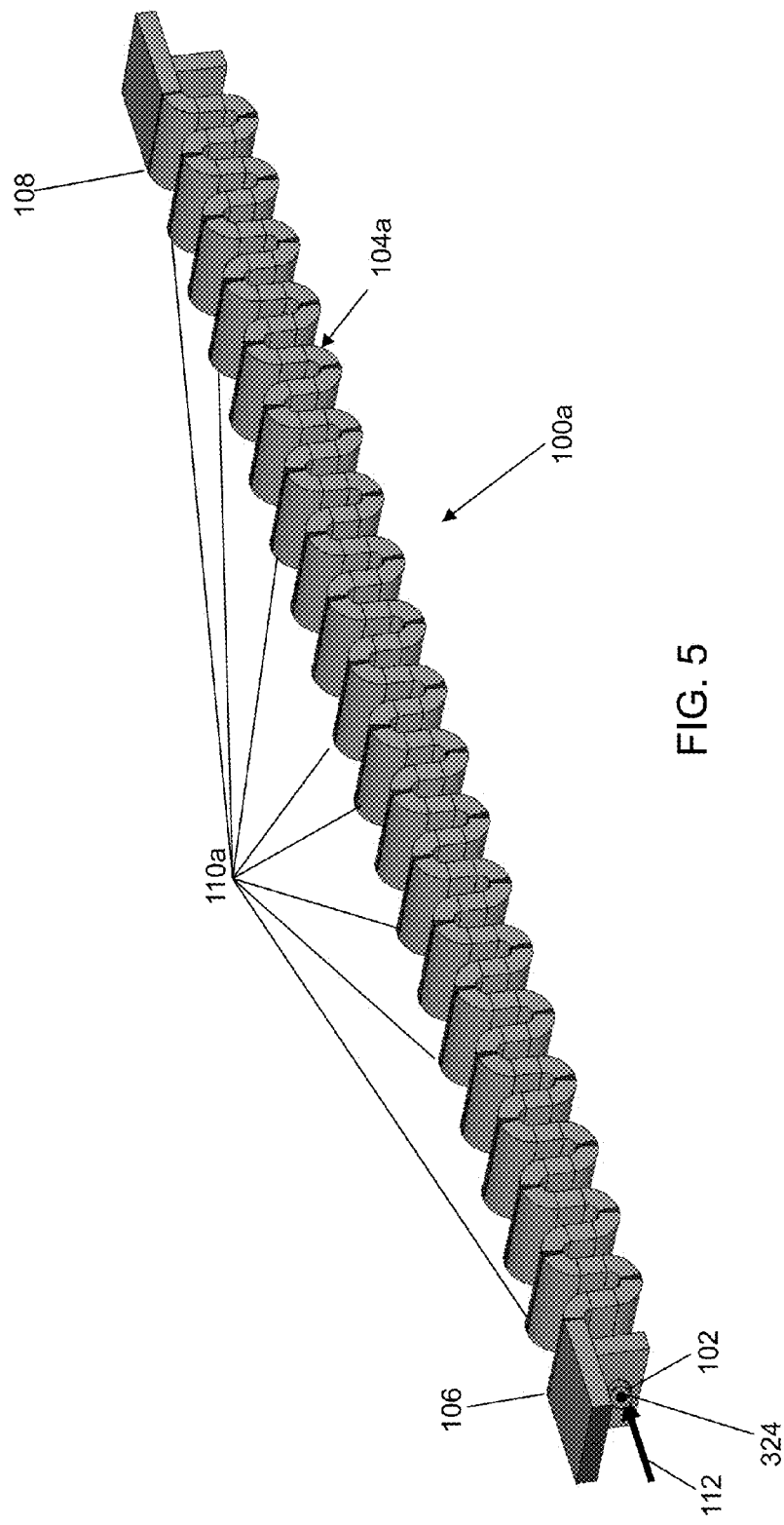
FIG. 5 is a perspective view of the FWTWT of FIG. 1 loaded with an epsilon negative material in accordance with an illustrative embodiment.

With reference to FIG. 5, a perspective view of a second TWT 100a is shown in accordance with an illustrative embodiment. Second TWT 100a may include electron beam vacuum tube 102 and a second SWS 104a. Second SWS 104a includes a second plurality of unit cells 110a along a length of second SWS 104a in a direction from input end 106 to output end 108. In the illustrative embodiment of FIG. 5, second SWS 104a includes 19 identical unit cells that form a serpentine, rectangular folded waveguide.

An epsilon negative material (ENG) is inserted in each of the second plurality of unit cells 110a. An ENG material has a real part of permittivity that is negative and a real part of permeability that is positive at the operational frequency $f_o$ of the RF signal input at input end 106. Electron beam vacuum tube 102 extends a length of second SWS 104a from input end 106 to output end 108 and through a center of second SWS 104a defined in direction of propagation 112 of electron beam 324.

In an illustrative embodiment, a cross section of second SWS 104a perpendicular to a direction of propagation of the RF signal is rectangular. Second SWS 104a supports propagation of a dominant $TE_{10}$ mode.

Figure 6:
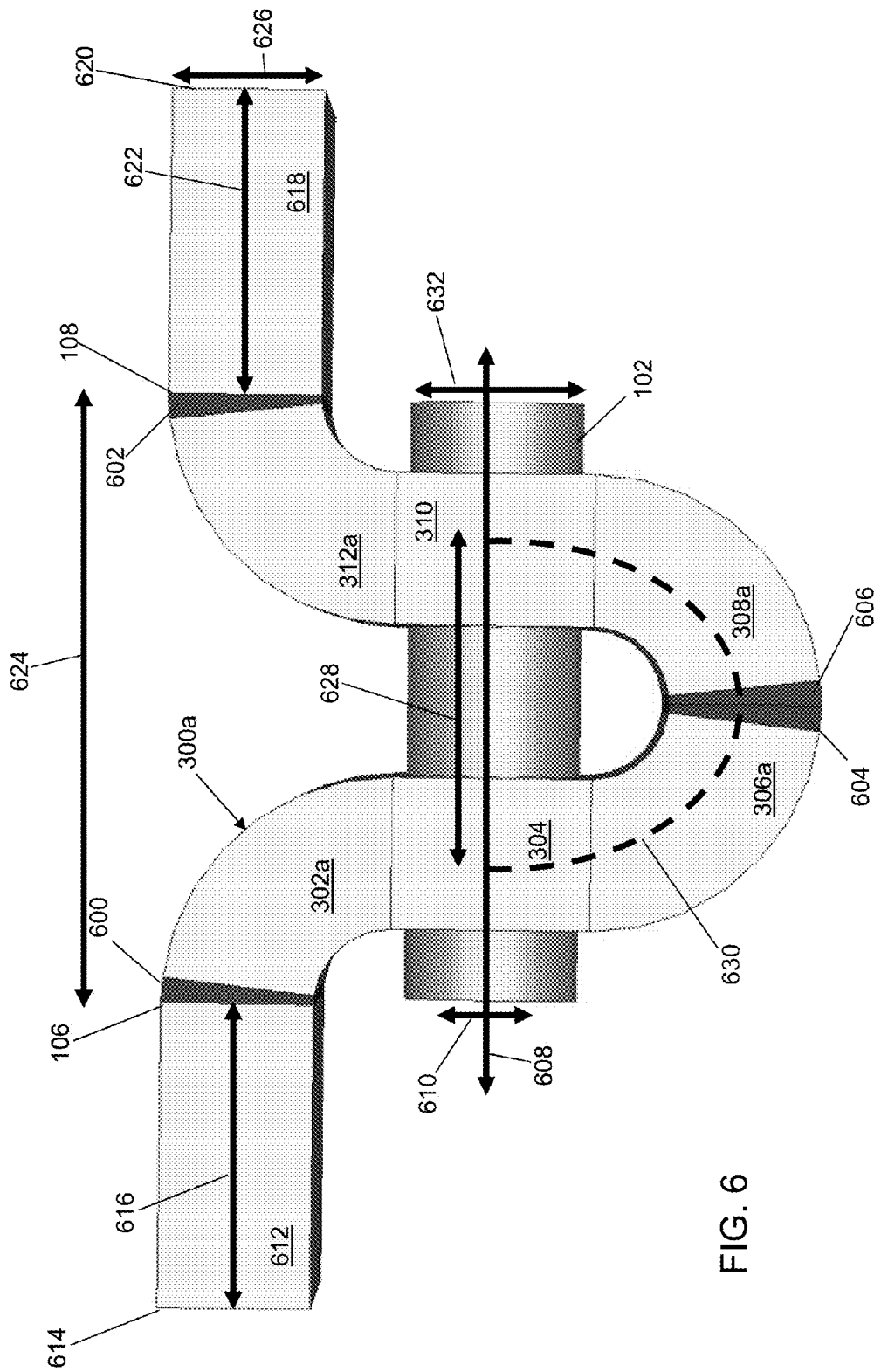
FIG. 6 is a side view of a unit cell of the loaded FWTWT of FIG. 5 in accordance with an illustrative embodiment.

Referring to FIG. 6, a second unit cell 300a of second SWS 104a is shown in accordance with an illustrative embodiment. Second unit cell 300a includes a seventh waveguide section 302a, second waveguide section 304, an eighth waveguide section 306a, a ninth waveguide section 308a, fifth waveguide section 310, and a tenth waveguide section 312a that form a continuous serpentine "U" shape. The dimensions of second waveguide section 304 and fifth waveguide section 310 in second unit cell 300a may be different from those used in unit cell 300. Each waveguide section is open where it mounts to the adjacent wave guide section. As understood by a person of skill in the art, the RF signal propagates in the interior of second SWS 104a, which may be filled with air. The walls that form seventh waveguide section 302a, second waveguide section 304, eighth waveguide section 306a, ninth waveguide section 308a, fifth waveguide section 310, and tenth waveguide section 312a may be formed of a material that is conductive at the operational frequency, $f_o$, of second TWT 100a.

Second waveguide section 304 is mounted between seventh waveguide section 302a and eighth waveguide section 306a. Fifth waveguide section 310 is mounted between ninth waveguide section 308a and tenth waveguide section 312a. the walls of seventh waveguide section 302a, eighth waveguide section 306a, ninth waveguide section 308a, and tenth waveguide section 312a are curved to form an E-plane semi-circular bend in the same manner, but rotated in different directions to form the serpentine external shape.

Seventh waveguide section 302a includes a first wedge 600 formed of ENG material. Because seventh waveguide section 302a is bent, first wedge 600 has a wedge shape. First wedge 600 is mounted across the rectangular cross section of seventh waveguide section 302a. In the illustrative embodiment, first wedge 600 is mounted across the rectangular cross section of seventh waveguide section 302a at a maximum distance from a center line 608 of second SWS 104a that is also a center line of electron beam vacuum tube 102. First wedge 600 may be mounted across the rectangular cross section of seventh waveguide section 302a at other locations.

Tenth waveguide section 312a includes a second wedge 602 formed of ENG material. Because tenth waveguide section 312a is bent, second wedge 602 forms a wedge shape. Second wedge 602 is mounted across the rectangular cross section of tenth waveguide section 312a. In the illustrative embodiment, second wedge 602 is mounted across the rectangular cross section of tenth waveguide section 312a at a maximum distance from center line 608 of second SWS 104a. Second wedge 602 may be mounted across the rectangular cross section of tenth waveguide section 312a at other locations.

Eighth waveguide section 306a includes a third wedge 604 formed of ENG material similar to first wedge 600 and second wedge 602. Ninth waveguide section 308a includes a fourth wedge 606 formed of ENG material similar to first wedge 600, second wedge 602, and third wedge 604. First wedge 600, second wedge 602, third wedge 604, and fourth wedge 606 have the same size and shape.

Each second unit cell 300a of the second plurality of unit cells 110a is identical and includes first wedge 600, second wedge 602, third wedge 604, and fourth wedge 606. First wedge 600, second wedge 602, third wedge 604, and fourth wedge 606 are mounted in second SWS 104a at periodic intervals in a direction of propagation of the RF signal through second SWS 104a or transverse to the serpentine path of the propagating RF signal. In the illustrative embodiment, air or vacuum is on either side of first wedge 600, second wedge 602, third wedge 604, and fourth wedge 606.

The electromagnetic effect of first wedge 600, second wedge 602, third wedge 604, and fourth wedge 606 can be characterized by assuming a straight waveguide loaded by an ENG slab of material having a thickness τ. The permittivity, $\epsilon_r$, can be characterized by the lossless Drude model as $$\epsilon_r = 1 - \left(\frac{f_p^{ENG}}{f}\right)^2,$$

where $f_p^{ENG}$ is the Drude plasma frequency and f is the operational frequency also denoted as $f_o$ herein. For the $TE_{10}$ mode propagating through the straight waveguide, the ENG slab is modeled by a short transmission line (TL) sandwiched between two transmission lines that represent the air-filled waveguide on either side of the ENG slab. Assuming a normalized characteristic impedance for the air-filled waveguide to be $Z_{air}=1$. The $TE_{10}$ normalized characteristic impedance, $Z_{ENG}$, for the ENG-filled waveguide is $Z_{ENG}=\beta_{air}/\beta_{ENG}$, where $$\beta_{air} = \sqrt{\left(\frac{2\pi f}{c}\right)^2 - \left(\frac{\pi}{a}\right)^2} \text{ and } \beta_{ENG} = \sqrt{\epsilon_r\left(\frac{2\pi f}{c}\right)^2 - \left(\frac{\pi}{a}\right)^2},$$

where c is the speed of light and a is cross section width 400 and $\beta_{air}$ and $\beta_{ENG}$ are the $TE_{10}$ phase constants for the air-filled waveguide and the ENG-filled waveguide, respectively.

The electrically short TL corresponding to the ENG-filled waveguide can be modeled by a two port T-network that includes lumped series and shunt elements, with normalized impedances $\overline{Z}_s$ and $\overline{Z}_p$, respectively. By making the ABCD-matrices for the ENG-filled TL and T-network equal to each other, the normalized series and shunt impedances in the T-network are evaluated as $\overline{Z}_p=-j\overline{Z}_{ENG}/\sin(\theta_{ENG})$ and $\overline{Z}_s=(\cos(\theta_{ENG})-1)\overline{Z}_p$, where $\theta_{ENG}=\beta_{ENG}\tau$. If $\theta_{ENG}$ is small, $\overline{Z}_s \approx 0$ and $$\overline{Z}_p = j\frac{\beta_{air}}{\left[-\epsilon_r\left(\frac{2\pi f}{c}\right)^2 + \left(\frac{\pi}{a}\right)^2\right]\tau}.$$

Because $\epsilon_r$ is negative, the normalized shunt impedance is purely inductive. As a result, the relatively thin ENG-filled waveguide acts as a shunt inductance loading the equivalent TL of the air-filled waveguide. A shunt inductance increases the phase velocity of the propagating RF signal through the waveguide. Therefore, the bands of propagation are shifted up to higher frequencies.

As just explained, first wedge 600, second wedge 602, third wedge 604, and fourth wedge 606 formed of ENG material act as a shunt inductance periodically loading an equivalent Bloch transmission line model of SWS 104. A shunt inductance increases the phase velocity of the propagating RF signal through second SWS 104a. By periodically loading second SWS 104a, the bands of propagation are shifted up to higher frequencies, for example, from an operational frequency, $f_0$, to a higher frequency $f_1 > f_0$. To operate second TWT 100a at the operational frequency $f_0$, the size of second TWT 100a is increased by a scale factor defined by $f_1/f_0$. The scale factor is selected to include the unloaded operational frequency, $f_0$, within the propagation band of second SWS 104a. A unit-cell phase shift of between 180° and 360° for the EM signal propagating through second SWS 104a is large enough to achieve a relatively slow zeroth-order spatial harmonic propagating inside electron beam vacuum tube 102. The scale factor is selected to avoid bringing second TWT 100a into cut-off, which occurs when the unit-cell phase shift equals 180° or 360°. Based on this, a desired scale factor may provide a unit-cell phase shift around 270°. As an example, for TWT 100, the operational frequency may be 48 GHz. Second TWT 100a, made from TWT 100, by adding first wedge 600, second wedge 602, third wedge 604, and fourth wedge 606 formed of ENG material, results in a propagation band that is shifted up to higher frequencies. For the unit-cell phase shift equal to 270°, the operational frequency for the ENG loaded second TWT 100a is 64 GHz, which is higher than the unloaded operational frequency of 48 GHz. To bring down the operational frequency of the ENG loaded second TWT 100a to the desired operational frequency of 48 GHz, the dimensions of the ENG loaded second TWT 100a are enlarged by a scale factor equal to $$\frac{f_1}{f_0} = \frac{64}{48} = 1.33.$$

in an illustrative embodiment, the scale factor used was 1.35 to enlarge the ENG loaded second TWT 100a. The corresponding unit-cell phase shift for the scale factor equal to 1.35 was 267.1° which is approximately equal to 270°.

A length 624 of second unit cell 300a extends between edges of seventh waveguide section 302a and tenth waveguide section 312a. The rectangular cross section of each waveguide section has a cross section height 626 and a cross section width (not shown). Second unit cell 300a defines an electron beam path length 628 and an EM wave path length 630. Electron beam vacuum tube 102 has a second beam diameter 610 and a diameter 632. Length 624, cross section height 626, and the cross section width of second unit cell 300a are increased by the scale factor thereby increasing electron beam path length 628 and EM wave path length 630. Second beam diameter 610 of second SWS 104a is larger than beam diameter 326 of SWS 104 by the scale factor supporting a larger current at the same operational frequency of SWS 104. Second TWT 100a further has a higher interaction impedance compared to TWT 100, which increases the gain.

In an illustrative embodiment, an average arc-length $L_{wedge}$ of each wedge may be selected as EM wave path length 630 divided by 20. The apex of the angle of the combined third wedge 604 and fourth wedge 606 at the intersection of eighth waveguide section 306a and ninth waveguide section 308a is $\theta_{wedge} = 2L_{wedge}/p$, where p is electron beam path length 628. If $\theta_{wedge}$ is larger than a threshold, such as 90°, the wedge may reduce a longitudinal component of the electric field in electron beam vacuum tube 102, which decreases the interaction impedance and degrades the gain performance of second TWT 100a. To avoid this, $\theta_{wedge}$ is generally small. For illustration, $\theta_{wedge} = 12.7°$ was used in an illustrative embodiment.

To perform a cold test of second TWT100a, an A-element in the ABCD-matrix associated with second unit cell 300a is determined. To calculate the ABCD-matrix of second unit cell 300a, a first rectangular waveguide 612 is mounted between an input port 614 and first wedge 600 and has a first longitudinal length 616, and a second rectangular waveguide 618 is mounted between an output port 620 and second wedge 602 and has a second longitudinal length 622. First rectangular waveguide 612 and second rectangular waveguide 618 have the same transverse cross section as second SWS 104a at input end 106 and at output end 108 of second unit cell 300a. First rectangular waveguide 612, second unit cell 300a, and second rectangular waveguide 618 form three-stages.

The reason for adding the input waveguide 612 and output waveguide 618 is to make the reference impedance the same as the $TE_{10}$ characteristic impedance of the air-filled straight waveguide. The s-parameters of the three-stage cascaded network depicted in FIG. 6 are calculated. For example, a frequency domain solver with a tetrahedral mesh type in CST Microwave Studio® marketed by CST Computer Simulation Technology AG may be used to analyze the s-parameters of the cascaded network over a frequency range. Using the calculated s-parameters, the corresponding ABCD-matrix, $[T]_{cas}$ is calculated as described in D. M. Pozar, *Microwave Engineering*, Hoboken, N.J., John Wiley and Sons, 2012. The ABCD-matrix of second unit cell 300a, $[T]_{unit}$, is calculated as $[T]_{unit} = [T]_\omega^{-1} [T]_{cas} [T]_\omega^{-1}$, where $[T]_\omega$ is calculated analytically as described in D. M. Pozar, *Microwave Engineering*, Hoboken, N.J., John Wiley and Sons, 2012 using the $TE_{10}$ characteristic impedance and the phase constant of the rectangular waveguide. The Brillouin phase shift between input end 106 and output end 108 of second unit cell 300a is calculated as $\emptyset = \cos^{-1} A_{unit}$ where $A_{unit}$ is the A-element of the unit-cell ABCD-matrix calculated as described in R. E. Collin, *Foundations for Microwave Engineering*, 2nd ed., Hoboken, N.J., John Wiley and Sons, 2001.

Figure 7:
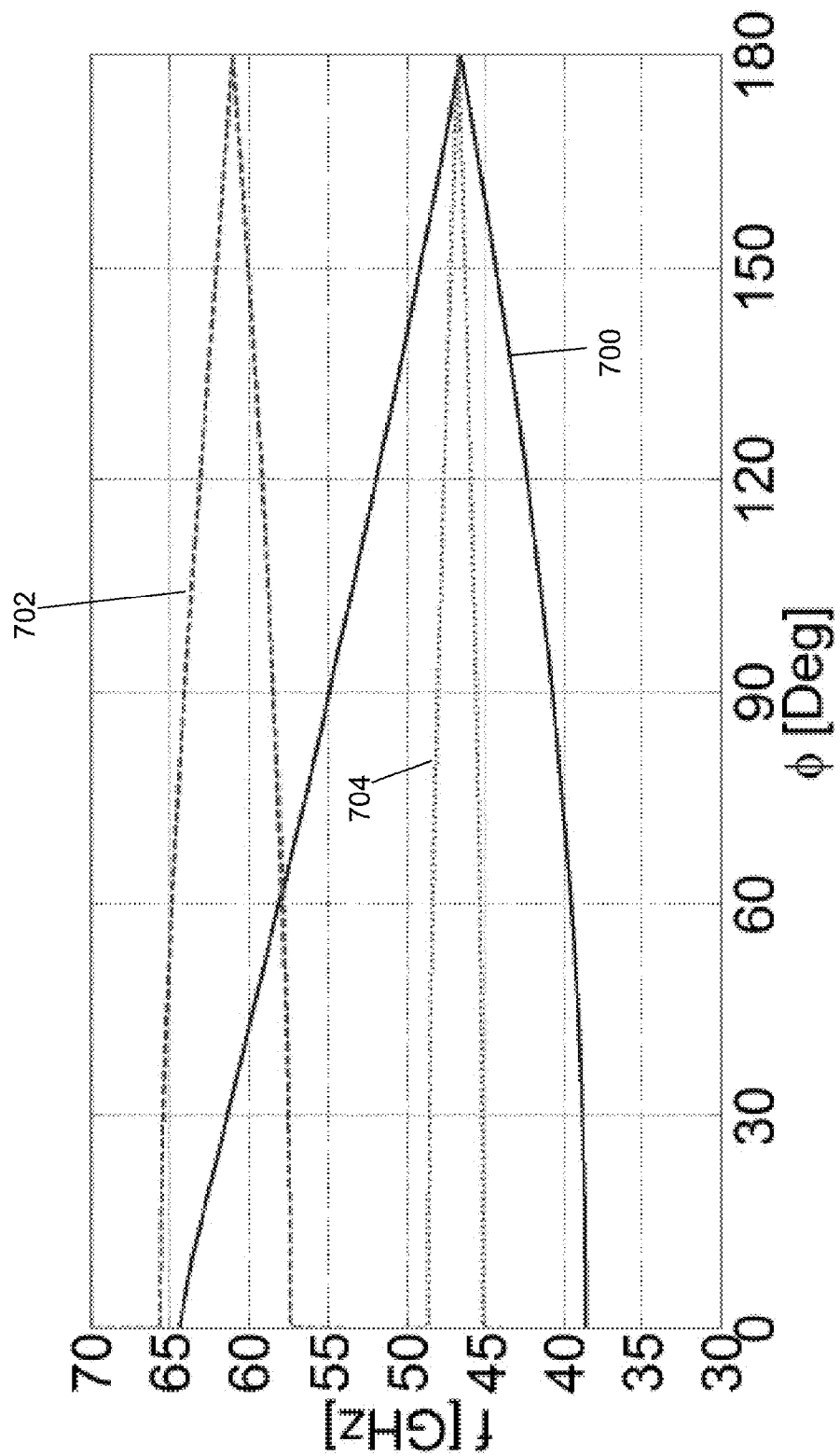
FIG. 7 is a graph showing a Brillouin dispersion relation comparison.

For illustration, a dispersion diagram for an RF wave is shown in FIG. 7. FIG. 7 shows a first dispersion curve 700, a second dispersion curve 702, and a third dispersion curve 704 as a function of phase, φ, in degrees (Deg) and frequency f in gigahertz (GHz). First dispersion curve 700 was calculated using TWT 100. Second dispersion curve 702 was calculated using second TWT 100a with the same dimensions as TWT 100. Third dispersion curve 704 was calculated using second TWT 100a increased in size relative to TWT 100 by the scale factor. The dispersion diagram shows that the propagation band in second TWT 100a is shifted up to the higher frequencies compared to that for TWT 100. To bring down the band of propagation, 'reverse-miniaturization' is performed which means scaling up the dimensions of second TWT 100a by the scale factor.

A unit cell phase shift, ψ, should be large enough at $f_0$ to achieve a relatively slow phase velocity for a zeroth order spatial harmonic inside the enlarged tunnel of electron beam vacuum tube 102. A preferable operational region in the propagation band of enlarged second TWT 100a is a second eigen mode for which 180° < ψ < 360°. However, $f_0$ should be far away from the upper cut-off frequency for which ψ = 360°. Therefore, ψ ≈ 270° is a relatively good choice. For third dispersion curve 704, ψ = 267.1° was used.

Figure 8:
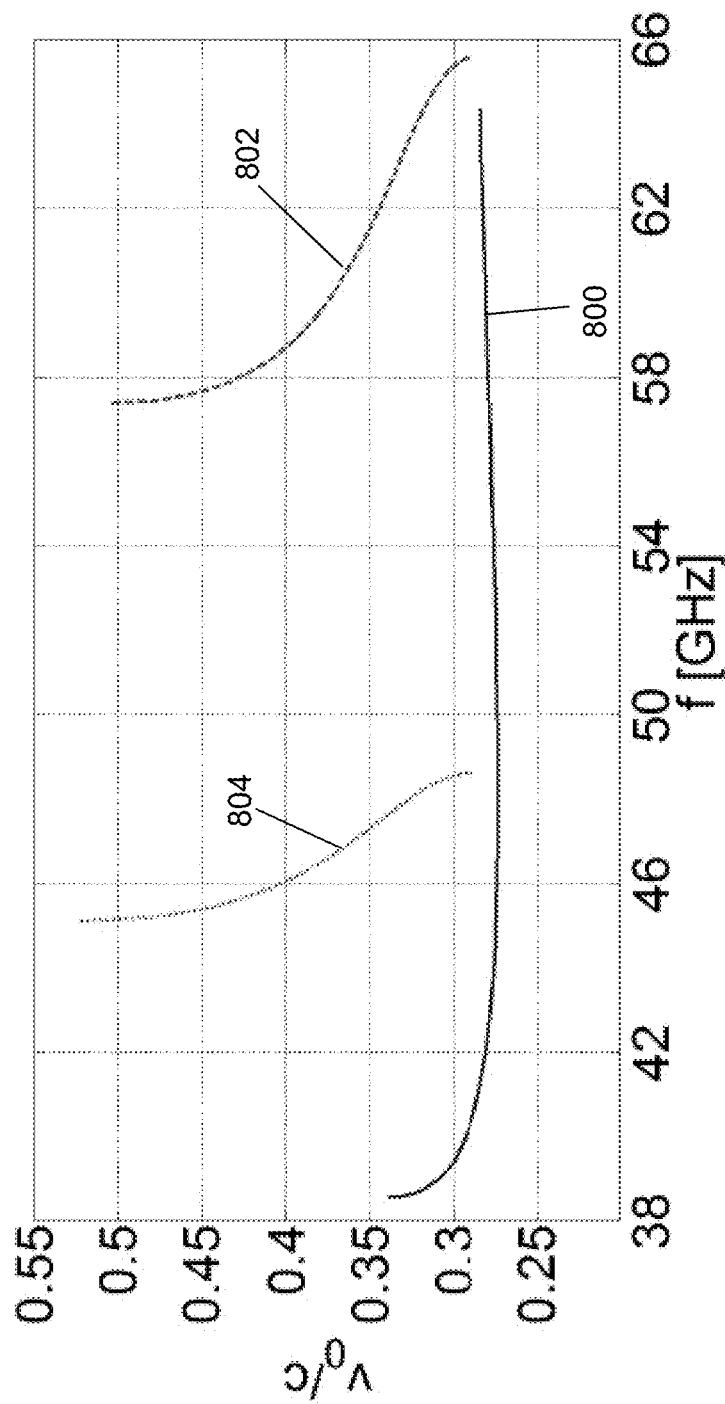
FIG. 8 is a graph showing a phase velocity comparison.

A slow wave velocity diagram for an RF wave is shown in FIG. 8. FIG. 8 shows a first velocity curve 800, a second velocity curve 802, and a third velocity curve 804 as a function of frequency f in gigahertz (GHz) and $V_0/c$ where is the $V_0$ electron velocity and c is the speed of light. First velocity curve 800 was calculated using TWT 100. Second velocity curve 802 was calculated using second TWT 100a with the same dimensions as TWT 100. Third velocity curve 804 was calculated using second TWT 100a increased in size relative to TWT 100 by the scale factor. At $f_0$, the slow wave phase velocity for the enlarged second TWT100a was slightly faster than for TWT 100. The bandwidth is narrower for the enlarged second TWT100a.

Figure 9:
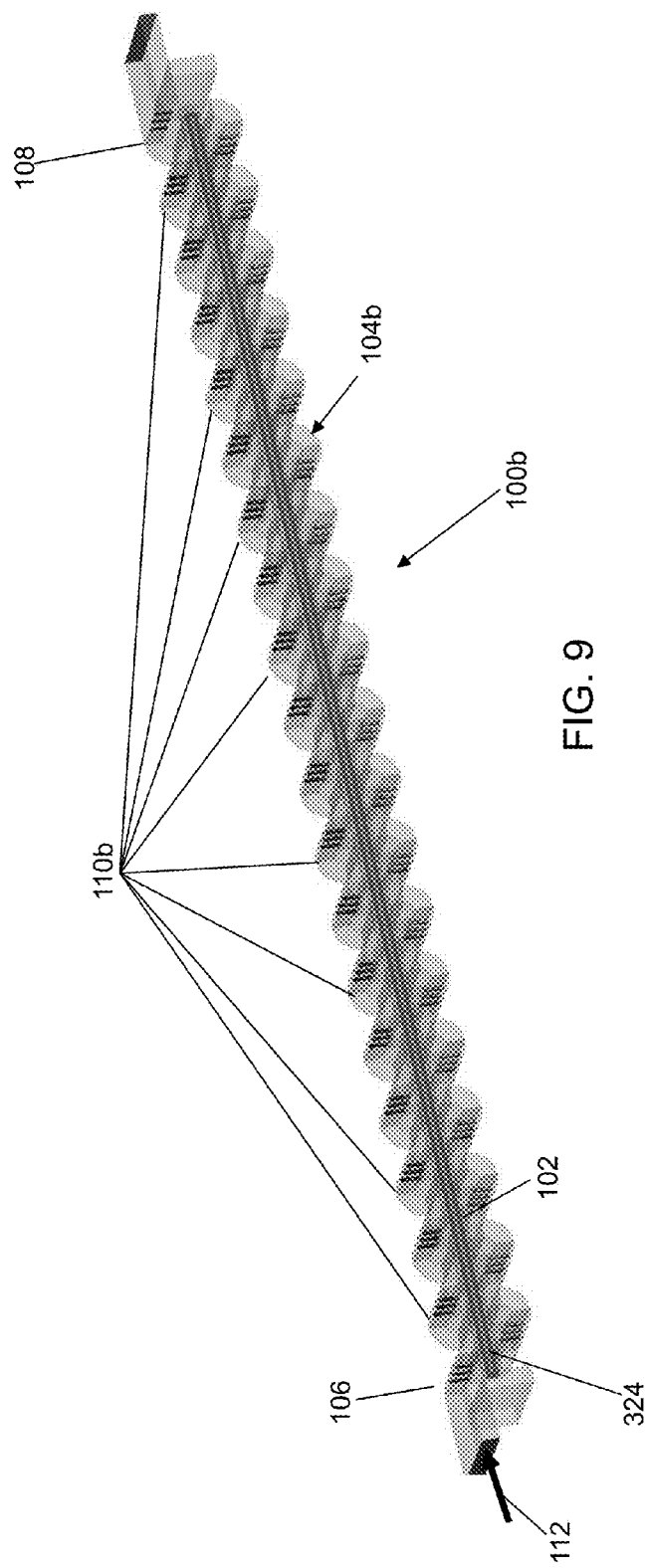
FIG. 9 is a perspective view of the FWTWT of FIG. 1 loaded with a material that behaves similar to the epsilon negative material of FIG. 5 in accordance with an illustrative embodiment.

With reference to FIG. 9, a perspective view of a third TWT 100b is shown in accordance with an illustrative embodiment. Third TWT 100b may include electron beam vacuum tube 102 and a third SWS 104b. Third SWS 104b includes a third plurality of unit cells 110b along a length of third SWS 104b in a direction from input end 106 to output end 108. In the illustrative embodiment of FIG. 9, third SWS 104b includes 19 identical unit cells that form a serpentine, rectangular folded waveguide. A plurality of wires are inserted in each of the third plurality of unit cells 110b. Electron beam vacuum tube 102 extends a length of third SWS 104b from input end 106 to output end 108 and through a center of third SWS 104b defined in direction of propagation 112 of electron beam 324.

In an illustrative embodiment, a cross section of third SWS 104b perpendicular to the direction of propagation of the RF signal is rectangular. Third SWS 104b supports propagation of a dominant $TE_{10}$ mode.

Figure 10:
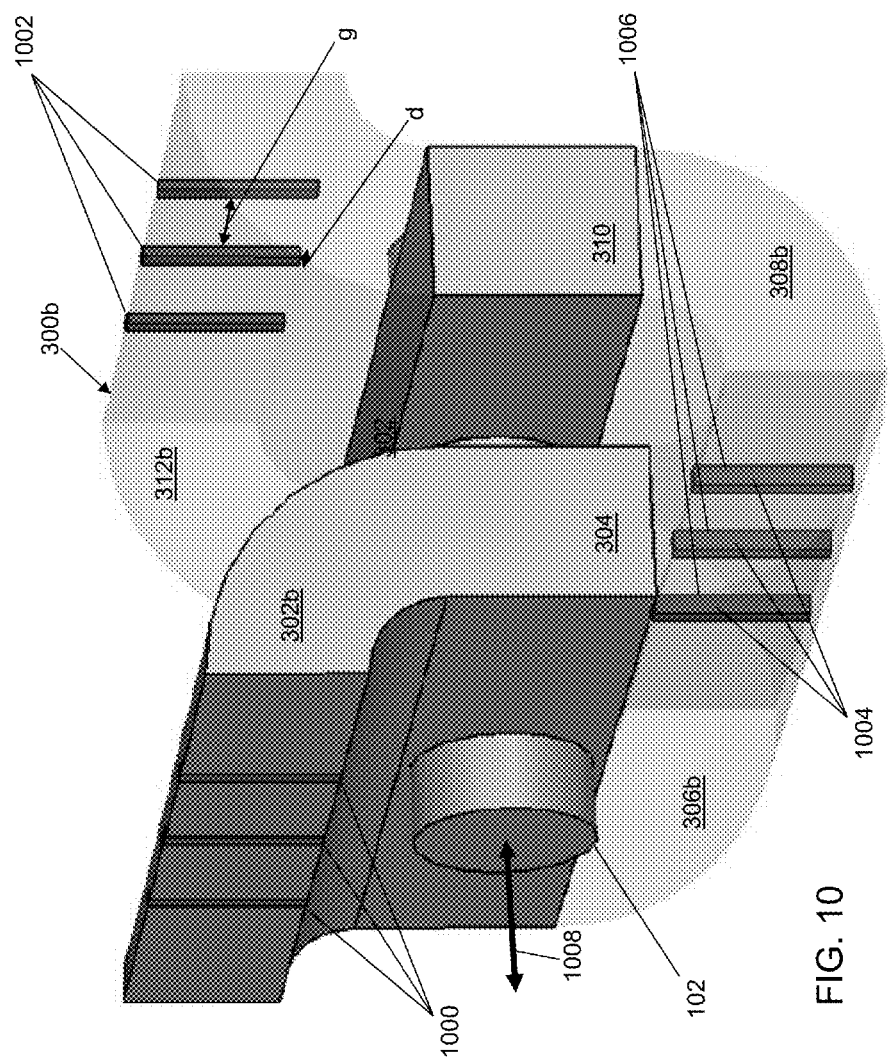
FIG. 10 is a perspective view of a unit cell of the loaded FWTWT of FIG. 9 in accordance with an illustrative embodiment.

Referring to FIG. 10, a third unit cell 300b of third TWT 100b is shown in accordance with an illustrative embodiment. Third unit cell 300b includes an eleventh waveguide section 302b, second waveguide section 304, a twelfth waveguide section 306b, a thirteenth waveguide section 308b, fifth waveguide section 310, and a fourteenth waveguide section 312b that form a continuous serpentine "U" shape. The dimensions of second waveguide section 304 and fifth waveguide section 310 in third unit cell 300b may be different from those used in unit cell 300. Each waveguide section is open where it mounts to the adjacent wave guide section. Second waveguide section 304 is mounted between eleventh waveguide section 302b and twelfth waveguide section 306b. Fifth waveguide section 310 is mounted between thirteenth waveguide section 308b and fourteenth waveguide section 312b. The walls of eleventh waveguide section 302b, twelfth waveguide section 306b, thirteenth waveguide section 308b, and fourteenth waveguide section 312b are curved to form an E-plane semi-circular bend in the same manner, but rotated in different directions to form the serpentine external shape.

Eleventh waveguide section 302b includes a first plurality of wires 1000. The first plurality of wires 1000 may be formed of a metal material and mounted to extend lengthwise across a portion of the cross section of eleventh waveguide section 302b. In the illustrative embodiment, the first plurality of wires 1000 includes three wires that extend lengthwise between the longer sides of the rectangular cross section of eleventh waveguide section 302b. In the illustrative embodiment, the first plurality of wires 1000 are mounted across the rectangular cross section of eleventh waveguide section 302b at a maximum distance from a center line 1008 of third SWS 104b that is also a center line of electron beam vacuum tube 102, wherein center line 1008 defines a line that extends through a center of second waveguide section 304 of third unit cell 300b in the x-direction and the y-direction of coordinate reference frame 114. The first plurality of wires 1000 may be mounted across the rectangular cross section of eleventh waveguide section 302b at other locations in different arrangements along third SWS 104b. For example, multiple arrays of the first plurality of wires may be included at different locations in eleventh waveguide section 302b in alternative embodiments.

Fourteenth waveguide section 312b includes a second plurality of wires 1002 similar to first plurality of wires 1000. Twelfth waveguide section 306b includes a third plurality of wires 1004 similar to the first plurality of wires 1000 and the second plurality of wires 1002. Thirteenth waveguide section 308b includes a fourth plurality of wires 1006 similar to the first plurality of wires 1000, the second plurality of wires 1002, and the third plurality of wires 1004. The first plurality of wires 1000, the second plurality of wires 1002, the third plurality of wires 1004, and the fourth plurality of wires 1006 have the same size and shape.

Each third unit cell 300b of the third plurality of unit cells 110b is identical and includes the first plurality of wires 1000, the second plurality of wires 1002, the third plurality of wires 1004, and the fourth plurality of wires 1006. The first plurality of wires 1000, the second plurality of wires 1002, the third plurality of wires 1004, and the fourth plurality of wires 1006 are mounted in third SWS 104b at periodic intervals in a direction of propagation of the RF signal through third SWS 104b or transverse to the serpentine path of the propagating RF signal. In the illustrative embodiment, vacuum surrounds each wire of the first plurality of wires 1000, the second plurality of wires 1002, the third plurality of wires 1004, and the fourth plurality of wires 1006 except for the walls of third SWS 104b. In an illustrative embodiment, a cross section of each wire is square though other shapes may be used. Each wire in each plurality of wires is separated from the adjacent wire by a spacing g and has a diameter d.

To determine a value of g and d for the plurality of wires 1000, 1002, 1004, 1006 that provide a similar performance to the ENG filled wedges 600, 602, 604, 606, a cascaded network equivalent to that shown in FIG. 6 is determined. The values of g and d are selected so that a scattering matrix of third SWS 104b is as close as possible to a scattering matrix of second SWS 104a at the operational frequency, $f_0$. The values of g and d may be selected by analyzing the wire grid cascaded network and iterating through various values of g and d to optimize the scattering matrix of third SWS 104b so that it is as close as possible to second SWS 104a at the operational frequency, $f_0$. Because the cascaded networks are lossless, optimizing on a magnitude and a phase of $s_{11}$ is sufficient.

Figure 11:
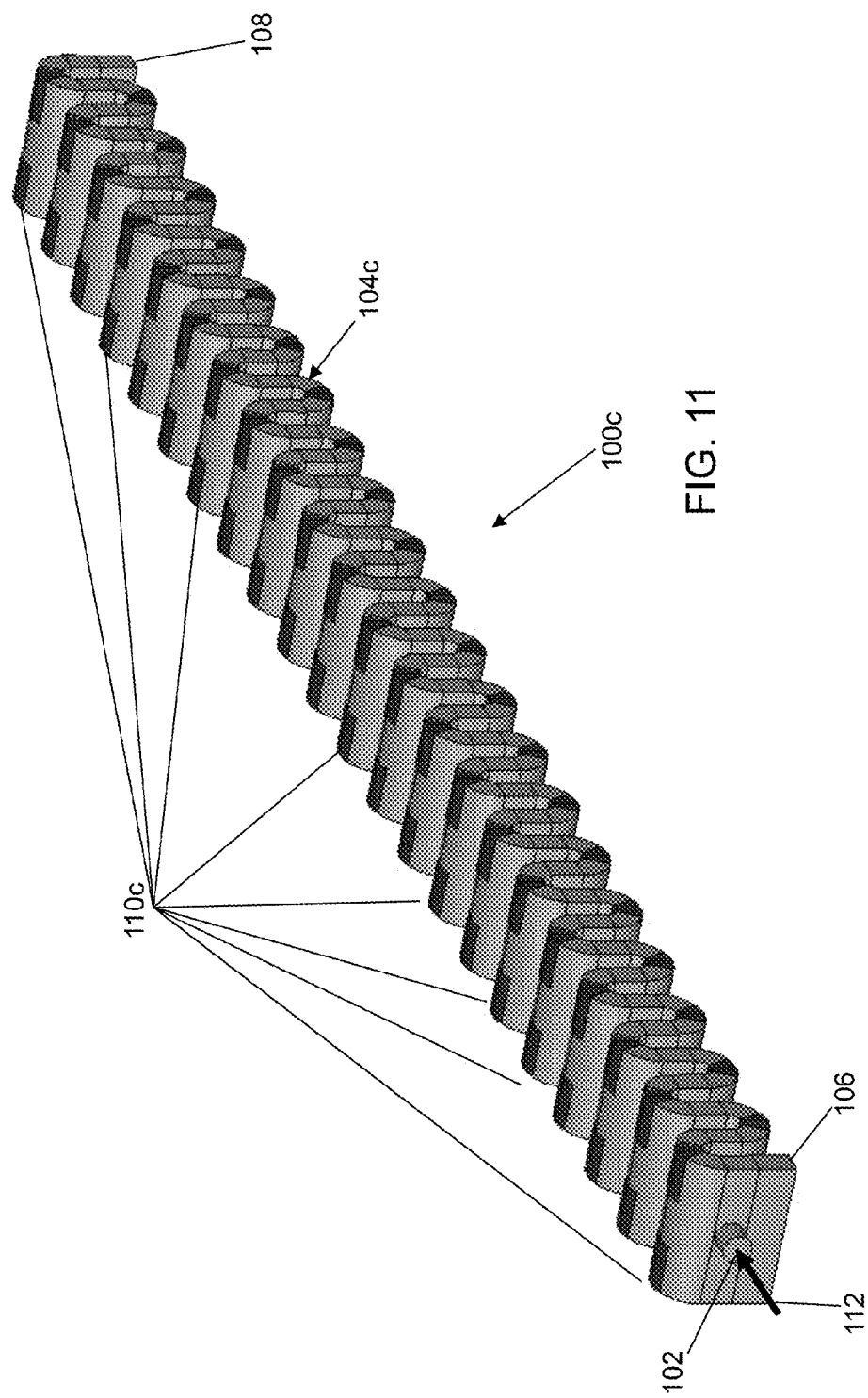
FIG. 11 is a perspective view of the FWTWT of FIG. 1 loaded with a second material that behaves similar to the epsilon negative material of FIG. 5 in accordance with an illustrative embodiment.

With reference to FIG. 11, a perspective view of a fourth TWT 100c is shown in accordance with an illustrative embodiment. Fourth TWT 100c may include electron beam vacuum tube 102 and a fourth SWS 104c. Fourth SWS 104c includes a fourth plurality of unit cells 110c along a length of fourth SWS 104c in a direction from input end 106 to output end 108. In the illustrative embodiment of FIG. 11, fourth SWS 104c includes 19 identical unit cells that form a serpentine, rectangular folded waveguide. Electron beam vacuum tube 102 extends a length of fourth SWS 104c from input end 106 to output end 108 and through a center of fourth SWS 104c defined in direction of propagation 112 of electron beam 324.

In an illustrative embodiment, a cross section of fourth SWS 104c perpendicular to the direction of propagation of the RF signal is rectangular. Fourth SWS 104c supports propagation of a dominant $TE_{10}$ mode.

Figure 12:
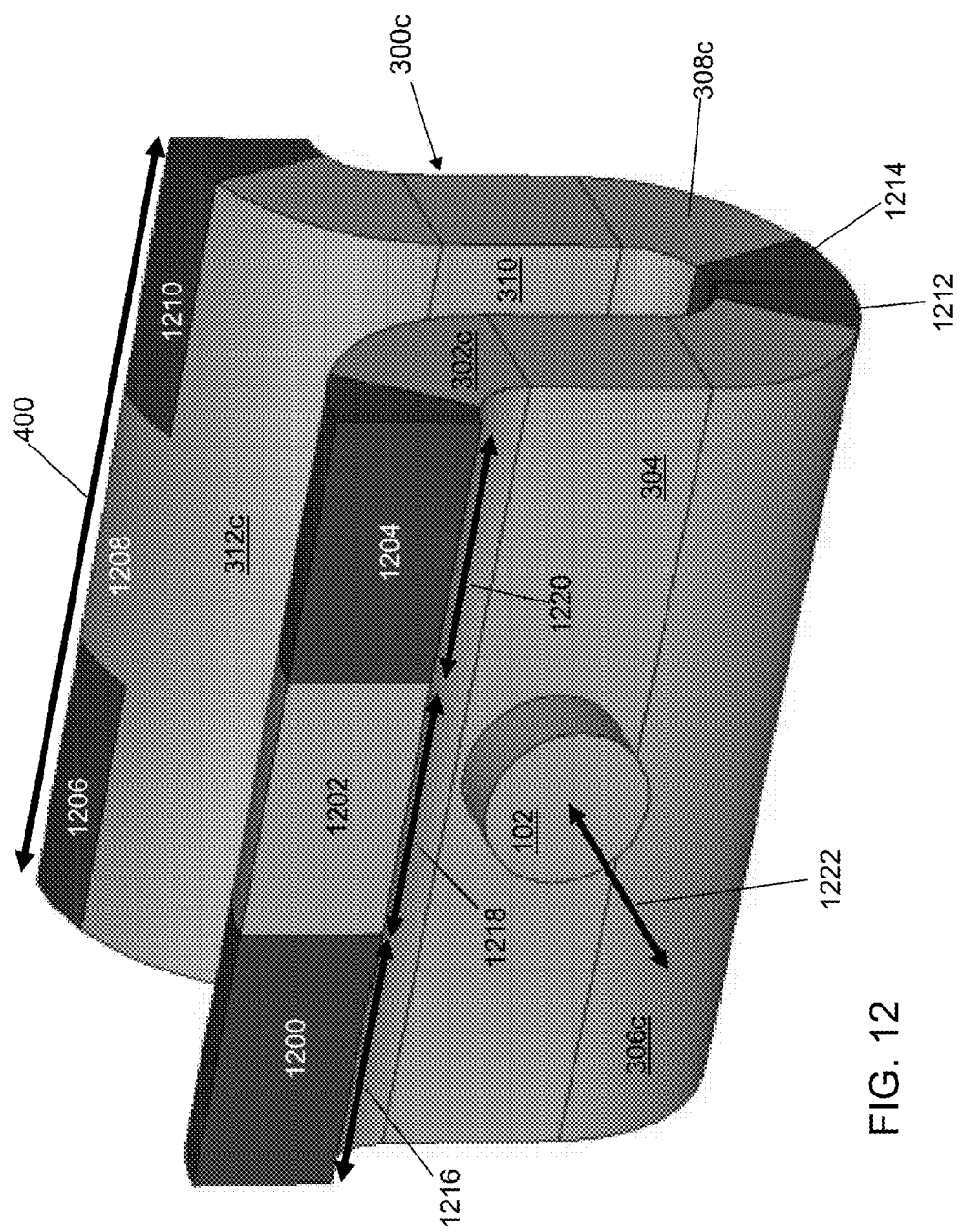
FIG. 12 is a perspective view of a unit cell of the loaded FWTWT of FIG. 11 in accordance with an illustrative embodiment.

Referring to FIG. 12, a fourth unit cell 300c of fourth TWT 100c is shown in accordance with an illustrative embodiment. Fourth unit cell 300c includes a fifteenth waveguide section 302c, second waveguide section 304, a sixteenth waveguide section 306c, a seventeenth waveguide section 308c, fifth waveguide section 310, and an eighteenth waveguide section 312c that form a continuous serpentine "U" shape. The dimensions of second waveguide section 304 and fifth waveguide section 310 in fourth unit cell 300c may be different from those used in unit cell 300. Each waveguide section is open where it joins the adjacent wave guide section. Second waveguide section 304 is mounted between fifteenth waveguide section 302c and sixteenth waveguide section 306c. Fifth waveguide section 310 is mounted between seventeenth waveguide section 308c and eighteenth waveguide section 312c. The walls of fifteenth waveguide section 302c, sixteenth waveguide section 306c, seventeenth waveguide section 308c, and eighteenth waveguide section 312c are curved to form an E-plane semi-circular bend in the same manner, but rotated in different directions to form the serpentine external shape.

Fifteenth waveguide section 302c includes a first plate 1200, a second plate 1202, and a third plate 1204. First plate 1200 and third plate 1204 may be formed of a metal material and mounted to extend lengthwise across a portion of the cross section of fifteenth waveguide section 302c. Second plate 1202 may be formed of another material including vacuum such that second plate 1202 is formed by the adjacent walls of first plate 1200 and third plate 1204 and of fifteenth waveguide section 302c. A greater or a fewer number of plates may be mounted to extend lengthwise across a portion of the cross section of fifteenth waveguide section 302c. In the illustrative embodiment, first plate 1200 and third plate 1204 extend lengthwise between the longer sides of the rectangular cross section of fifteenth waveguide section 302c and only partially lengthwise between shorter sides of the rectangular cross section of fifteenth waveguide section 302c to leave an air gap that forms second plate 1202. In the illustrative embodiment, first plate 1200, second plate 1202, and third plate 1204 are mounted across the rectangular cross section of fifteenth waveguide section 302c at a maximum distance from a center line 1222 of fourth SWS 104c that is also a center line of electron beam vacuum tube 102, wherein center line 1222 defines a line that extends through a center of second waveguide section 304 of fourth unit cell 300c in the x-direction and the y-direction of coordinate reference frame 114. First plate 1200, second plate 1202, and third plate 1204 may be mounted across the rectangular cross section of fifteenth waveguide section 302c at other locations.

Eighteenth waveguide section 312c includes a fourth plate 1206, a fifth plate 1208, and a sixth plate 1210 similar to first plate 1200, second plate 1202, and third plate 1204, respectively. Sixteenth waveguide section 306c includes a seventh plate (not shown), an eighth plate (not shown), and a ninth plate 1212 similar to first plate 1200, second plate 1202, and third plate 1204, respectively. Seventeenth waveguide section 308c includes a tenth plate (not shown), an eleventh plate (not shown), and a twelfth plate 1214 similar to first plate 1200, second plate 1202, and third plate 1204, respectively.

Each fourth unit cell 300c of the fourth plurality of unit cells 110c is identical. The plates are mounted in fourth SWS 104c at periodic intervals in a direction of propagation of the RF signal through fourth SWS 104c or transverse to the serpentine path of the propagating RF signal. First plate 1200 has a first width 1216, second plate 1202 has a second width 1218, and third plate 1204 has a third width 1220. A sum of first width 1216, second width 1218, and third width 1220 is equal to the cross section width of each waveguide section 302c, 304, 306c, 308c, 310, 312c.

In an illustrative embodiment, the middle plates, such as second plate 1202 and fifth plate 1208, form a cut-off waveguide. First width 1216 and third width 1220 each have a width equal to approximately 35% of the cross section width of the associated waveguide section. Second width 1218 is approximately 30% of the cross section width of the associated waveguide section.

Figure 13:
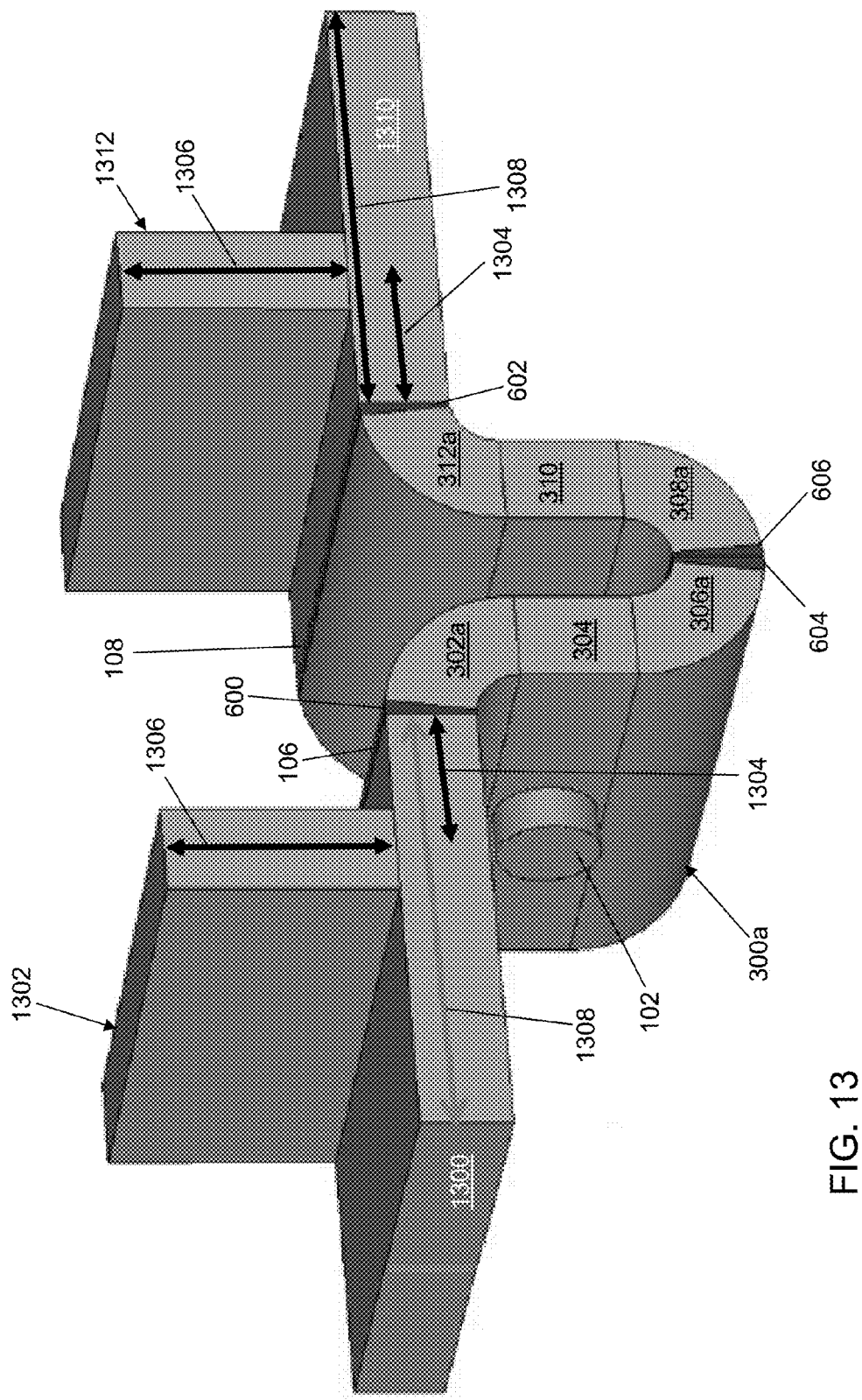
FIG. 13 is a perspective view of the unit cell of the loaded FWTWT of FIG. 5 with a matching network in accordance with an illustrative embodiment.

With reference to FIG. 13, a perspective view of second unit cell 300a is shown with a matching network designed to match the input/output waveguide to avoid reflection of the incident power in accordance with an illustrative embodiment. Third unit cell 300b and fourth unit cell 300c may be similarly matched. To design the matching network, the Bloch impedance of second TWT 100a is matched to the characteristic impedance ($TE_{10}$ mode) of the input/output waveguide. The matching network illustrated in FIG. 13 includes an input waveguide 1300 and an input stub tuner 1302. Input waveguide 1300 is mounted to first wedge 600 of seventh waveguide section 302a to provide the RF input signal. Input stub tuner 1302 mounts to and extends perpendicular from input waveguide 1300 at a distance 1304 from first wedge 600 of seventh waveguide section 302a. Input stub tuner 1302 may be mounted to extend either up or down from input waveguide 1300. Input stub tuner 1302 has a height 1306 and input waveguide 1300 has a length 1308.

Because of the symmetry, the output matching network is a mirrored version of the input one. As a result, the matching network illustrated in FIG. 13 includes an output waveguide 1310 and an output stub tuner 1312. Output waveguide 1310 is mounted to second wedge 602 of tenth waveguide section 312a to provide the RF output signal. Output stub tuner 1312 mounts to and extends perpendicular from output waveguide 1310 at distance 1304 from second wedge 602 of tenth waveguide section 312a. Output stub tuner 1312 may be mounted to extend either up or down from output waveguide 1310. Output stub tuner 1312 has height 1306 and output waveguide 1310 has length 1308.

For TWT 100, a matching network may not be needed because the $TE_{10}$ characteristic impedances of the folded and straight waveguides is very close. However, for second TWT 100a, there may be a large difference between the Bloch impedance and the $TE_{10}$ characteristic impedance of the waveguide.

To calculate the Bloch impedance $Z_B$, the B- and C-elements of the ABCD-matrix associated with the enlarged second TWT 100a is determined as $$Z_B = \sqrt{\frac{B_{unit}}{C_{unit}}}.$$

Distance 1304 and height 1306 can be computed using either a Smith chart or the analytical formulas described in D. M. Pozar, *Microwave Engineering*, Hoboken, N.J., John Wiley and Sons, 2012.

As used in this disclosure, the term "mount" includes join, unite, connect, couple, associate, insert, hang, hold, affix, attach, fasten, bind, paste, secure, bolt, screw, rivet, pin, nail, clasp, clamp, cement, fuse, solder, weld, glue, form over, slide together, layer, and other like terms. The phrases "mounted on" and "mounted to" include any interior or exterior portion of the element referenced. These phrases also encompass direct connection (in which the referenced elements are in direct contact) and indirect connection (in which the referenced elements are not in direct contact, but are mounted together via intermediate elements). Elements referenced as mounted to each other herein may further be integrally formed together. As a result, elements described herein as being mounted to each other need not be discrete structural elements. The elements may be mounted permanently, removably, or releasably.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A slow wave structure of a traveling wave tube comprising:
   a tube;
   an input port at a second end of the tube;
   an output port at a second end of the tube;
   a first material mounted within the tube between the input port and the output port; and
   a second material, wherein the second material is mounted in the first material at periodic intervals in a direction of propagation of a radio frequency signal between the input port and the output port, and the second material has a real part of permittivity that is negative and a real part of permeability that is positive at an operational frequency of the radio frequency signal.

2. The slow wave structure of claim 1, wherein the tube is a helical coil formed by the first material and the second material, and the second material is mounted across at least a portion of the cross section of the helical coil.

3. The slow wave structure of claim 1, wherein the first material is vacuum.

4. The slow wave structure of claim 3, wherein the tube is a coupled cavity waveguide having a cross section perpendicular to the direction of propagation of the radio frequency signal.

5. The slow wave structure of claim 4, wherein the second material is mounted across at least a portion of the cross section of the coupled cavity waveguide.

6. The slow wave structure of claim 3, wherein the tube is a folded waveguide having a cross section perpendicular to the direction of propagation of the radio frequency signal.

7. The slow wave structure of claim 6, wherein the second material is mounted across at least a portion of the cross section of the folded waveguide.

8. A traveling wave tube comprising:
   a slow wave structure comprising
   an input port at a first end of the slow wave structure;
   an output port at a second end of the slow wave structure;
   a first material mounted within the slow wave structure between the input port and the output port; and
   a second material, wherein the slow wave structure is configured to receive a radio frequency signal through the input port and to output an amplified radio frequency signal through the output port, wherein the radio frequency signal has an operational frequency; and
   an electron beam vacuum tube configured to receive an electron beam and to focus the electron beam for transmission therethrough, wherein the electron beam vacuum tube is mounted to extend lengthwise through a center of the slow wave structure defined in a plane perpendicular to a direction of propagation of the electron beam,
   wherein the second material is mounted in the first material at periodic intervals in a direction of propagation of the radio frequency signal between the input port and the output port, and the second material has a real part of permittivity that is negative and a real part of permeability that is positive at the operational frequency.

9. The traveling wave tube of claim 8, wherein the slow wave structure is a helical coil formed by the first material and the second material, and the second material is mounted across at least a portion of a cross section of the helical coil.

10. The traveling wave tube of claim 8, wherein the first material is vacuum.

11. The traveling wave tube of claim 10, wherein the slow wave structure is a folded waveguide having a cross section perpendicular to the direction of propagation of the radio frequency signal.

12. The traveling wave tube of claim 11, wherein the second material is mounted across at least a portion of the cross section of the folded waveguide.

13. The traveling wave tube of claim 12, wherein the folded waveguide is a serpentine folded waveguide.

14. The traveling wave tube of claim 13, wherein the second material forms a wedge.

15. The traveling wave tube of claim 12, wherein the second material is mounted at a maximum distance from the center of the slow wave structure.

16. The traveling wave tube of claim 12, wherein the second material is a metal plate that extends across the portion of the cross section of the folded waveguide.

17. The traveling wave tube of claim 16, wherein the cross section is rectangular and the metal plate extends lengthwise between longer sides of the rectangular cross section and only partially lengthwise between shorter sides of the rectangular cross section.

18. The traveling wave tube of claim 12, wherein the second material is a plurality of metal wires that extend lengthwise across the portion of the cross section of the folded waveguide.

19. The traveling wave tube of claim 18, wherein the cross section is rectangular and the plurality of metal wires extend lengthwise between longer sides of the rectangular cross section.

20. The traveling wave tube of claim 8, wherein the second material provides a shunt inductive load to the slow wave structure.

* * * * *